Aug. 12, 1969 L. LAURIE, JR 3,461,008

METHOD AND APPARATUS FOR ETCHING PRINTED CIRCUIT BOARDS

Filed Oct. 21, 1965 2 Sheets-Sheet 1

Lee Laurie Jr.
INVENTOR.

BY Neal J Mosely
his Attorney

Aug. 12, 1969 L. LAURIE, JR 3,461,008

METHOD AND APPARATUS FOR ETCHING PRINTED CIRCUIT BOARDS

Filed Oct. 21, 1965 2 Sheets-Sheet 2

Lee Laurie Jr.
INVENTOR.

BY Neal J. Mosely
His Attorney

United States Patent Office 3,461,008
Patented Aug. 12, 1969

3,461,008
METHOD AND APPARATUS FOR ETCHING PRINTED CIRCUIT BOARDS

Lee Laurie, Jr., P.O. Box 297, Oxford, Md. 21654

Filed Oct. 21, 1965, Ser. No. 499,273
Int. Cl. C23f *1/02;* C01g *49/10*
U.S. Cl. 156—3 8 Claims

ABSTRACT OF THE DISCLOSURE

In the preparation of printed circuit boards, metal clad boards with preselected areas protected against chemical attack are dipped into and out of an etching solution at a rate of about 30–45 cycles per minute. The circuit boards are preferably copper clad and the etching solution is preferably ferric chloride or nitric acid. The apparatus for effecting the method includes motor driven means driving supporting cords or cables extending over one or more pulleys and connected to a supporting bar supporting a plurality of printed circuit boards for immersion into and out of an etching bath.

This invention relates to new and useful improvements in methods and apparatus for the etching of printed circuit boards.

In the manufacture of printed circuit boards for use in electrical apparatus, copper clad boards are printed with a chemically resistant lacquer in the pattern desired for the circuit on the board. The boards are then etched with a chemical solvent for metallic copper, e.g., ferric chloride, nitric acid, etc., to remove the copper in the areas of the board which are not coated with the resist lacquer. The etched boards are then washed to remove the etching solution and are prepared for assembly of electrical components (e.g., tubes, transistors, resistors, capacitors, etc.) thereon. In some cases, the resist lacquer applied to the boards prior to chemical treatment is removed and the boards covered with a protective lacquer coating at all points except terminals where electrical components are to be assembled.

In the preparation of printed circuit boards, one major problem has been the efficient handling of large numbers of boards rapidly. The boards which are to be etched cannot be merely dipped in etching solutions since it has been found that there is a tendency for the etching solution to undercut around the resist circuit design areas. At the present, the most rapid method of processing printed circuit boards involves the application of the etching solution in the form of a spray. The spraying of panels is quite efficient but has not proved adaptable to high speed processing.

Accordingly, it is one object of this invention to provide a new and improved method and apparatus for efficient high speed etching of printed circuit boards.

Another object of this invention is to provide a new and improved method for etching of printed circuit boards which will process a large number of boards simultaneously without undercutting the desired circuit pattern.

A feature of this invention is the provision of an improved method and apparatus for etching printed circuit boards by dipping the boards into and out of an etching solution at a high rate of speed.

Other objects and features of this invention will become apparent from time to time throughout the specification and claims as hereinafter related.

This invention comprises a new and improved apparatus and method for high speed etching of printed circuit boards without undesirable undercutting. The invention is based upon the discovery that printed circuit boards may be etched by rapid dipping into and out of an etching solution at a high rate of speed. The invention is further concerned with a novel apparatus for dipping the printed circuit boards into and out of an etching solution.

Figures 2, 3:
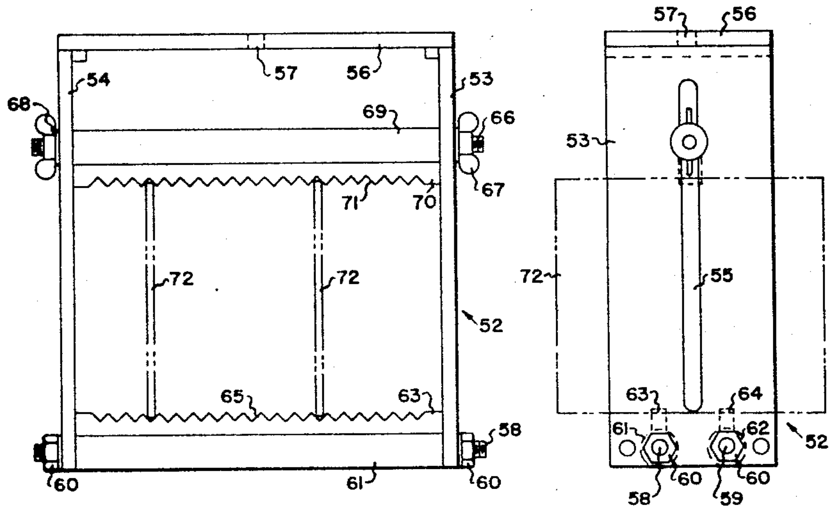
Figure 1:
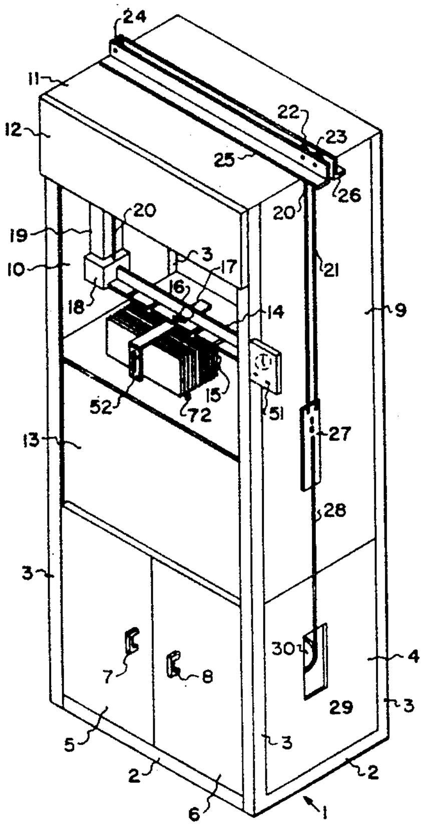
Figure 5:
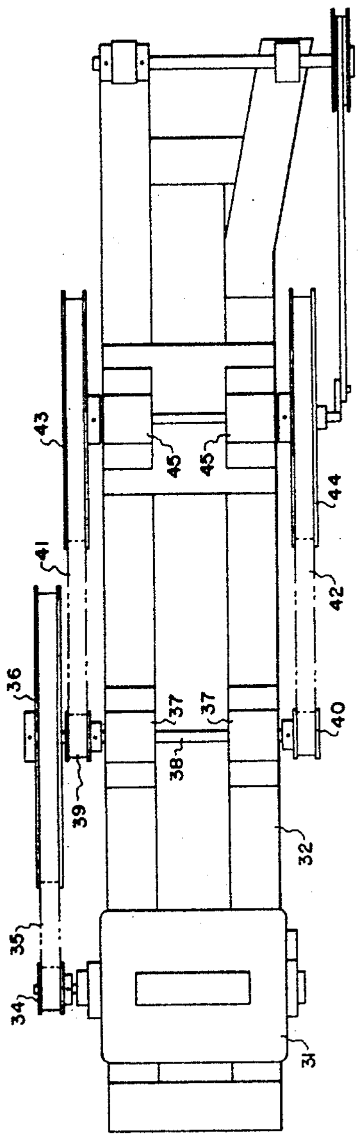
Figure 4:
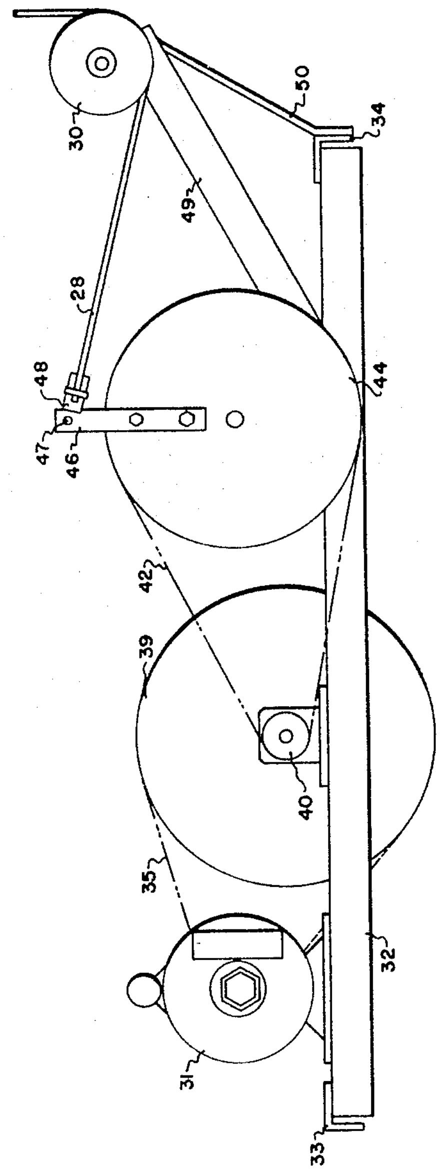

In the accompanying drawings, to be taken as a part of this specification, there is clearly and fully illustrated a preferred embodiment of this invention, in which drawings, FIG. 1 is a view in perspective of an improved apparatus for dipping printed circuit boards into and out of an etching solution, FIG. 2 is a detail view in right elevation of the circuit board holders for the apparatus shown in FIG. 1, FIG. 3 is a view in end elevation of the circuit board holder shown in FIG. 2, FIG. 4 is a view in elevation of the drive mechanism for the apparatus shown in FIG. 1, and FIG. 5 is a plan view of the drive mechanism shown in FIG. 4.

Referring to the drawings by numerals of reference and more particularly to FIG. 1, there is shown an improved apparatus for raising and lowering printed circuit boards into an etching bath at a predetermined high rate of speed. The apparatus is generally designated 1 and comprises a frame formed of angle iron supports and metal panels, preferably of steel coated with a chemically resistant covering such as asphaltum. The apparatus comprises an angle iron frame consisting of a plurality of horizontally extending angle irons 2 and vertically extending angle irons 3. The apparatus is enclosed at the bottom by end panels 4, positioned at each end, a rear panel (which is not seen in FIG. 1) and doors 5 and 6 positioned at the front and provided with handles 7 and 8 respectively.

The upper portion of the apparatus is enclosed by side panels 9 and 10, top panel 11, a rear panel (which is not seen in FIG. 1), and front panel 12. Midway up the apparatus there is provided a tank or container 13 which is formed of asphaltum coated steel side panels and bottom and is open at the top for immersion of printed circuit boards into an etching solution contained therein.

At the upper portion of the apparatus there is provided a mechanism for supporting printed circuit boards and raising and lowering said boards into an etching solution. There is provided an angle iron support 14 which has a plurality of slots 15 for receiving a bolt 16 and wing nut 17 for securing a circuit board supporting frame in position. Angle iron member 14 is secured at each end to blocks 18 having extensions (not shown) positioned within hollow rectangular guides 19 at each end of the apparatus. The supporting frame for the printed circuit boards is shown in more detail in FIGS. 2 and 3 and will be described further in the description of those figures. The supporting blocks 18 are secured on a pair of cables or cords 20 and 21 respectively. Cords 20 and 21 extend over pulleys 22 and 23 and cord 20 extends over pulley 24. The pulleys 22, 23 and 24 are supported at the top of the apparatus between a pair of angle irons 25 and 26. The arrangement of pulleys 22 ,23 and 24 and supporting cords or cables 20 and 21 is such that the movement of the cords 20 and 21 is operable to cause the angle iron support 14 and the printed circuit boards supported thereon to be reciprocated vertically into and out of the etching solution. The cables or cords 20 and 21 are connected to the upper end of connecting member 27 which is in turn connected at its lower end to a cord or cable 28 which extends through aperture 29 in the end wall 4 of the apparatus and over pulley 30 to a drive mechanism shown in more detail in FIGS. 4 and 5. Member 27 provides for adjustment in the extent of movement of the printed circuit boards into and out of the etching solution.

In FIGS. 4 and 5 the drive mechanism for the apparatus is shown comprising motor 31 which is supported on support plate 32 mounted on angle irons 33 and 34 extending across the interior of the lower enclosed part of the apparatus. Access to the motor and drive mechanism for servicing and adjustment is had by opening doors 5 and 6. Motor 31 is provided with drive pulley 34 which drives pulley belt 35 on speed reducing drive pulley 36. Drive pulley 36 is mounted on bearings 37 and supported on shaft 38 on which there are positioned small drive pulleys 39 and 40 respectively. Pulleys 39 and 40 operate belts 41 and 42 which are connected on large drive pulleys 43 and 44 respectively. The pulleys 33 and 34 are mounted on bearings 45. Pulley 44 is provided with a bar 46 extending radialy outward and having holes 47 at its outer end in which there is secured one end of a connector 48 to which is secured the end of cable or cord 28. Cable or cord 28 extends around pulley 30 as shown in FIG. 1 and operates cords or cables 20 and 21 for reciprocating the printed circuit board holder up and down into and out of the etching solution bath. Pulley 30 is supported on a frame consisting of support members 49 and 50 respectively which are adjustable. As the motor drives the various pulleys, pulley 44 on rotation is operable to move cord 28 back and forth at a rate corresponding to the rate of revolution of that pulley. This causes cord 28 to reciprocate the printed circuit board holder up and down at the same rate as the rate of revolution of pulley 44. The rate of revolution of pulley 44 may be any predetermined value based on the relative size of the various drive pulleys in relation to the motor 31. If desired, the apparatus can be operated by an adjustable speed motor or any of the pulleys could be replaced by a pulley arrangement permitting speed adjustment. The motor 31 is turned off and on through an electric circuit which is not shown, but which may be a simple on-off switch or a timer switch 51, as shown in FIG. 1.

In FIGS. 2 and 3, the circuit board holders are shown in more detail. The circuit board holders are generally designated 52 and comprise a pair of end plate members 53 and 54 having vertically extending slots 55. The upper ends of plates 53 and 54 are joined by horizontally extending plate 56 which has a hole 57 at the center receiving the securing bolt 16 (as shown in FIG. 1). Plate members 53, 54 and 56 are of sheet plastic, such as acrylic, cellulose butyrate, or polystyrene. The lower ends of plate members 53 and 54 are joined by a pair of rods 58 and 59 (preferably of stainless steel) which are threaded at opposite ends and provided with nuts 60 for securing the apparatus together. Each of rods 58 and 59 is provided with a tubular sleeve 61 and 62, respectively, type of plastic as used in plates 53, 54 and 56. Sleeves 61 and 62 are provided with longitudinally extending members 63 and 64 which are cemented thereto or which may be molded integrally therewith. Members 63 and 64 are each provided with a plurality of notches designated 65, as shown in FIG. 2. Toward the upper end portion of the circuit board holders there is provided a rod 66 extending between plates 53 and 54 through the slot 55. Rod 66 is preferably of stainless steel and is threaded at opposite ends and provided with wing nuts 67 and 68, also preferably of stainless steel. Rod 66 is surrounded by a sleeve 69, preferably of the same plastic as used for rods 61 and 62. Sleeve 69 is provided with longitudinally extending members 70 which may be cemented thereto or formed integrally therewith. Member 70 is provided with a plurality of notches 71 of the same size and shape as notches 65 and generally aligned with the notches 65. The wing nuts 67 and 68 may be released or tightened to permit rod 66 and sleeve 69 to be moved upwardly and downwardly in slots 55 to permit introduction and removal of printed circuit boards which are generally designated 72. The adjustment of rod 66 and sleeve 69 in slots 55 relative to rods 58 and 59 and sleeves 61 and 62 permits the insertion of printed circuit boards 72 of different sizes and shapes into various holders of this type. The printed circuit boards 72 are supported between the notches 65 and 71, as shown in FIGS. 2 and 3. The several slots 15 in the angle iron support 14 for the printed circuit board holders permit the positioning of several printed circuit board holders (as many as four or five or more, depending upon the size of the apparatus) so that up to 100 or more printed circuit boards may be processed at one time in the apparatus.

In operation, the tank 13 is filled to a suitable depth with the etching solution, preferably ferric chloride, although other solvents for metallic copper, such as ammonium persulfate, nitric acid and the like, may be used. The motor and pulley sizes are selected to provide a reciprocating motion for the apparatus in the range from about 30 to 45 cycles per minute, preferably about 36 to 40 cycles per minute. The circuit boards are placed in the holders, which are designed to hold 25 boards each (larger or smaller sizes can be used if desired) and up to four or more holders may be used in the apparatus at one time. Thus, the apparatus in a typical commercial operation will handle 100 boards, 6 in. x 6 in., of 1 oz. copper cladding in approximately 15 minutes. The holders can be adjusted in width and in height to accommodate any size boards. They may be used for boards as small as ½ in. x ¾ in. or smaller and as large as 6 in. x 10 in. or larger. Boards 20 in. long by 7 in. wide have been etched in this apparatus using two holders, one positioned at each end of the board. With these adjustable holders boards of different sizes can be etched at the same time, each holder holding one particular size of board.

The apparatus is operated by the motor to reciprocate the boards into and out of the etching solution at a rate of 36 to 40 cycles per minute. This rate of dipping the boards into and out of the etching solution is quite critical since it gives a rate of etching which is essentially the same as is accomplished by an etching spray but without any tendency toward undercut of the printed circuit pattern. The apparatus for reciprocating printed circuit boards into and out of the etching solution represents a special application of a novel method for etching printed circuit boards. The method consists simply of the reciprocal dipping of the boards into and out of an etching solution at a high rate of speed, viz. 36 to 40 cycles per minute, for a predetermined time sufficient to etch the copper from the untreated areas on the printed circuit boards. This rate of dipping of the boards into the solution permits a rapid handling of a large number of printed circuit boards in a relatively short time (e.g., 15 min. for 100 boards, 6" x 6" of 1 oz. copper) without undercutting the desired printed circuit areas. The boards may be washed in this apparatus by draining tank 13 and filling it with wash water. Theoretically, this reciprocation of the boards into and out of an etching solution could be accomplished by hand or by a manually operated apparatus. However, the apparatus described above represents a preferred means for carrying out a new and improved method of etching printed circuit panels.

While this invention has been described fully and completely with special emphasis upon a single preferred embodiment, it should be understood that within the scope of the appended claims the invention may be practiced otherwise than as specifically described herein.

What is claimed is:

1. In the method of preparing printed circuit boards wherein selected areas of a metal clad insulating board are etched to remove metal and leave metal clad areas of preselected size and shape, the improvement which comprises dipping said metal clad boards, with preselected areas protected against chemical attack, into and out of an etching solution at a rate of speed of about 30–45 cycles per minute.

2. A method as defined in claim 1 in which the printed circuit boards are copper clad boards.

3. A method as defined in claim 1 in which the boards are washed after etching.

4. A method as defined in claim 1 in which the boards are dipped into and out of the etching solution at a rate of 36 to 40 cycles per minute.

5. A method as defined in claim 4 in which the etching solution is ferric chloride or nitric acid.

6. An apparatus for etching printed circuit boards comprising an open tank for holding an etching solution, means including a horizontally extending bar and an adjustable support for supporting a plurality of printed circuit boards in spaced parallel relation and means including a motor, drive means including a pulley and supporting cords or cables connected to the end of said supporting bar, and the rotation of said pulley operating said supporting cords or cables to reciprocate said supporting bar vertically at a high rate of speed to dip said printed circuit boards into and out of said tank.

7. An apparatus as defined in claim 6 in which said adjustable support comprises a pair of notched horizontally extending plastic members positioned to support printed circuit boards between the notches thereof, and means for adjustably supporting said notched members.

8. An apparatus as defined in claim 7 in which said adjustable supporting means comprises a pair of vertically extending plastic plate members, a first rod extending through one of said notched members and said plate members, a pair of nuts secured on the ends of said rod to secure said plate members and notched members together, said plate members having vertically extending slots therein, a second rod extending through the other notched member and through said slots, and a pair of nuts secured on said second rod to secure the same adjustably at any selected position in said slots.

References Cited

UNITED STATES PATENTS

| | | | |
|---|---|---|---|
| 1,415,589 | 5/1922 | Leinbach | 134—164 |
| 1,646,690 | 10/1927 | Doty | 134—164 |

JACOB H. STEINBERG, Primary Examiner

U.S. Cl. X.R.

134—164; 156—345